United States Patent [19]

Freller

[11] 3,963,839

[45] June 15, 1976

[54] METHOD FOR THE PREPARATION OF THIN LAYERS OF TUNGSTEN AND MOLYBDENUM

[75] Inventor: Helmut Freller, Nurnberg, Germany

[73] Assignee: Siemens Aktiengesellschaft, Munich, Germany

[22] Filed: Aug. 29, 1974

[21] Appl. No.: 501,660

[30] Foreign Application Priority Data

Sept. 14, 1973 Germany.......................... 2346394

[52] U.S. Cl.............................. 427/251; 427/255; 427/252; 427/294; 427/314; 427/347
[51] Int. Cl.$^2$......................................... C23C 11/02
[58] Field of Search.................. 117/106, 62, 107.2; 427/252, 255, 241, 294, 314, 347, 251

[56] References Cited
UNITED STATES PATENTS

| | | | |
|---|---|---|---|
| 3,294,654 | 12/1966 | Norman et al. | 117/107.2 |
| 3,462,298 | 8/1969 | Ikeda et al. | 117/106 R |
| 3,669,724 | 6/1972 | Brand | 117/106 R |

*Primary Examiner*—Ronald Smith
*Assistant Examiner*—Janyce A. Bell
*Attorney, Agent, or Firm*—Kenyon & Kenyon Reilly Carr & Chapin

[57] ABSTRACT

Preparation of thin layers of tungsten or molybdenum on a highly temperature-resistant layer substrate by thermal evaporation in a high vacuum, where $WO_3$ or $MoO_3$, respectively, is evaporated and the layer substrate is heated so that the oxides are decomposed and a pure tungsten or molybdenum layer is deposited on the layer substrate.

5 Claims, No Drawings

METHOD FOR THE PREPARATION OF THIN LAYERS OF TUNGSTEN AND MOLYBDENUM

BACKGROUND OF THE INVENTION

The invention concerns a method for the preparation of thin layers of tungsten or molybdenum on a highly temperature-resistant layer substrate by thermal evaporation under high vacuum.

The heavy metals, tungsten and molybdenum, are useful materials for many X-ray tubes and electron tubes because of their high melting points and high-temperature strength properties. Other applications of these heavy metals include contacts in high-voltage switchgear and for evaporators in vapor-deposition installations for high-vacuum metallizing.

In certain applications, particularly for rotary anodes of X-ray tubes, thin layers of these heavy metals on highly temperature-resistant layer substrates, such as, for instance, electro graphite or $Al_2O_3$ ceramics, are desired. These thin layers can be prepared by costly and cumbersome methods such as fusion electrolysis, precipitation from the vapor phase of chemical compounds or by plasma spraying. Vapor deposition of thin layers on layer substrates, however, presents difficulties because of the high melting point and the lower vapor pressure of tungsten and molybdenum. Although it is possible to vapor-deposit tungsten or molybdenum by means of electron-beam evaporation or cathode sputtering, the far more economical thermal vapor deposition under high vacuum, which is easier to control as far as layer formation is concerned, fails mainly because of the high evaporator temperatures required. For example, the thermal evaporation of tungsten and molybdenum requires temperatures of between 3000° and 3500° C. Until recently, it has not been possible to find a suitable material for the evaporator to withstand these temperatures. (See L.I. Maissel and R. Glang, Handbook of Thin-Film Technology, McGraw-Hill, 1970, p. 1–54).

SUMMARY OF THE INVENTION

It is therefore the object of this invention to provide a method for the preparation of thin layers of tungsten or molybdenum on a highly temperature-resistant layer substrate by evaporation in a vacuum, in which the formation of the layer can be easily controlled.

The process of the instant invention comprises the steps of:

a. heating a heavy metal oxide selected from the group consisting of tungsten VI oxide and molybdenum VI oxide under high vacuum to form an evaporated metal oxide;

b. contacting said evaporated metal oxide with a temperature-resistant layer substrate heated at a temperature sufficient to decompose said evaporated metal oxide whereby said metal oxide is decomposed at the vicinity of or at the surface of said layer into a solid heavy metal phase and a gaseous oxygen phase, said heavy metal phase being deposited as a thin layer on said substrate; and c. removing said gaseous oxygen phase from said evaporated metal oxide as it is formed.

The tungsten (VI) oxide or molybdenum (VI) oxide is evaporated and the layer substrate is heated to such a temperature that the tungsten (VI) oxide or the molybdenum (VI) oxide is depomposed in the immediate vincinity or at the surface of the layer substrate into a solid tungsten or molybdenum phase and a gaseous oxygen phase and a layer of pure tungsten or molybdenum is produced on the surface of the layer substrate, the gaseous oxygen phase being pumped off continuously. The volatile tungsten (VI) oxide ($WO_3$) or molybdenum (VI) oxide ($MoO_3$) is evaporated at temperatures between 700° C. and 1250° C. by thermal evaporation in a high vacuum. At these relatively low evaporation temperatures, conventional evaporators can be used. If the layer substrate is not heated, the corresponding oxides precipitate on its surface. With increasing temperature of the layer substrate, further precipitation of oxide is decreased because of re-evaporation, until above a critical temperature of the layer substrate the oxides are decomposed and precipitation of pure tungsten or molybdenum is produced. This critical temperature corresponds to the decomposition point of the tungsten (VI) oxide or the molybdenum (VI) oxide, i.e., that temperature at which the oxides are decomposed. As the decomposition point cannot be fixed exactly like other conversion points (ABC Chemie vol. 2, Verlag Harri Deutsch, Frankfurt-/Main and Zurich, page 1557), the temperature of the layer substrate, at which a pure deposit of tungsten or molybdenum is obtained with certainty, is determined experimentally as a function of the residual gas pressure of the high vacuum. The temperatures so determined can be exceeded; the temperature range naturally being limited upward by the evaporation temperature of the layer substrate material or of the tungsten or molybdenum. During the entire evaporation process the gaseous oxygen phase, which is produced by the decomposition of the oxides, is pumped off continuously, in order to avoid an undesirable increase of the pressure in the vapor deposition apparatus. By virtue of the instant method, the layer formation can be controlled easily by the evaporation time or by weighing the oxide. The vapor-deposited layers exhibit very good adhesion, because the surface of the layer substrate is completely degassed by the heating prior to the vapor deposition. It is a further advantage of the instant method that the starting materials for the evaporation, tungsten (VI) oxide or molybdenum (VI) oxide are considerably cheaper than the corresponding pure metals.

For preparing thin films of tungsten, tungsten (VI) oxide is advantageously evaporated at a temperature of 1250° C. and a residual gas pressure of $10^{-5}$ Torr and the layer substrate is heated to a temperature of $\geq 1500°$ C. For the preparation of thin films of molybdenum, molybdenum (VI) oxide is advantageously evaporated at a temperature of 750° C. and a residual gas pressure of $10^{-5}$ Torr and the layer substrate is heated to a temperature of 900° C. With the values given for the residual gas pressure and the evaporation temperatures, commercially available vapor deposition apparatus can be used. For the heating of the layer substrates to temperatures of above 1500° or 900° C., respectively, additional resistance heating must be provided.

During the evaporation, the layer substrate is preferably rotated about a vertical axis. In the case of plane layer substrates, this measure ensures uniform distribution of the layer thickness of the tungsten or the molybdenum.

It is particularly preferred to rotate the layer substrate during the evaporation about two mutually inclined axes. The layer substrate thereby executes a tumbling motion, so that the angle of the vapor-deposition beam relative to the surface of the layer substrate changes continuously. Particularly in the case of uneven or perforated layer substrates, coating of the entire surface with a uniform film thickness distribution is thus assured.

The invention will be further illustrated by the following examples.

EXAMPLE 1

A substrate of graphite, 3 mm thick, 80 mm long and 15 mm wide, was arranged in a vapor-deposition apparatus above an evaporator. The evaporator, which consisted of a resistance-heated tungsten boat, was filled with powdered tungsten (VI) oxide. The vapor-deposition apparatus was then evacuated by a high-vacuum pump to a residual gas pressure of $10^{-5}$ Torr and a substrate was heated by resistance heating to a temperature of 1500° C. During an evaporation time of 10 minutes, a tungsten film about 1 $\mu$m thick was vapor-deposited on the substrate at an evaporator temperature of 1250° C., the high-vacuum pump remaining in operation during the entire vapor deposition process. The tungsten layer so prepared exhibited excellent adhesion. The electric resistivity of the vapor-deposited tungsten layer corresponded to that of pure tungsten.

EXAMPLE 2

A substrate of $Al_2O_3$ ceramic, 3 mm thick, 80 mm long and 15 mm wide, was arranged in a vapor deposition apparatus above an evaporator. Powdered molybdenum (VI) oxide was filled into the evaporator, which consisted of a resistance-heated tungsten boat. Subsequently, the vapor-deposition apparatus was evacuated by a high-vacuum pump to a residual gas pressure of $10^{-5}$ Torr and a substrate was heated by resistance heating to a temperature of 1200° C. During an evaporation time of 10 minutes, a molybdenum film about 1 $\mu$m thick was vapor-deposited on the substrate at an evaporator temperature of 750° C., while the high-vacuum pump remained in operation during the entire vapor-deposition process. The molybdenum layer so produced likewise exhibited very good adhesion. The electric resistivity of the vapor-deposited molybdenum layer corresponded to that of pure molybdenum.

What is claimed is

1. Method for the preparation of thin layers of a heavy metals selected from the group consisting of tungsten and molybdenum on a highly temperature-resistant substrate comprising:
   a. heating a heavy metal oxide selected from the group consisting of tungsten VI oxide and molybdenum VI oxide under high vacuum to form an evaporated metal oxide;
   b. contacting said evaporated metal oxide with a temperature-resistant substrate heated at a temperature sufficient to decompose said evaporated metal oxide whereby said metal oxide is decomposed at the vicinity of or at the surface of said substrate into a solid heavy metal phase and a gaseous oxygen phase, said heavy metal phase being deposited as a thin layer on said substrate; and
   c. removing said gaseous oxygen phase from said evaporated metal oxide as it is formed.

2. The method of claim 1, which further comprises rotating said layer substrate about a vertical axis.

3. The method of claim 1, which further comprises rotating said layer substrate about two mutually inclined axes.

4. Method for the preparation of thin layers of tungsten on a highly temperature-resistant substrate comprising:
   a. heating tungsten (VI) oxide at a temperature of 1250° C. at $10^{-5}$ Torr to form an evaporated tungsten oxide;
   b. contacting said evaporated tungsten oxide with a temperature-resistant substrate heated to a temperature of at least 1500° C. whereby said evaporated tungsten oxide is decomposed at the vicinity of or at the surface of said substrate into a solid tungsten metal phase and a gaseous oxygen phase, said tungsten metal phase being deposited as a thin layer on said substrate; and
   c. removing said gaseous oxygen phase from said evaporated tungsten oxide as it is formed.

5. Method for the preparation of thin layers of molybdenum on a highly temperature-resistant substrate comprising:
   a. heating a molybdenum VI oxide at 750° C. and $10^{-5}$ Torr to form an evaporated molybdenum oxide;
   b. contacting said evaporated molybdenum oxide with a temperature-resistant layer substrate heated to a temperature of at least 900° C. whereby said evaporated molybdenum oxide is decomposed at the vicinity of or at the surface of said substrate into a solid molybdenum metal phase and a gaseous oxygen phase, said molybdenum metal phase being deposited as a thin layer on said substrate; and
   c. removing said gaseous oxygen phase from said evaporated metal oxide as it is formed.

* * * * *